United States Patent
Barry et al.

(10) Patent No.: US 7,062,696 B2
(45) Date of Patent: Jun. 13, 2006

(54) ALGORITHMIC TEST PATTERN GENERATOR, WITH BUILT-IN-SELF-TEST (BIST) CAPABILITIES, FOR FUNCTIONAL TESTING OF A CIRCUIT

(75) Inventors: John Lee Barry, County Cork (IE); Marc Harold Erett, Waterford (IE); James Mears, Puyallup, WA (US); Mark Sauerwald, Cumberland, ME (US); Afif Farhat, San Jose, CA (US)

(73) Assignee: National Semiconductor, Santa Clara, CA (US)

( * ) Notice: Subject to any disclaimer, the term of this patent is extended or adjusted under 35 U.S.C. 154(b) by 346 days.

(21) Appl. No.: 09/759,557

(22) Filed: Jan. 12, 2001

(65) Prior Publication Data

US 2001/0034866 A1    Oct. 25, 2001

Related U.S. Application Data

(60) Provisional application No. 60/176,434, filed on Jan. 14, 2000.

(51) Int. Cl.
G01R 31/28    (2006.01)
(52) U.S. Cl. ..................... 714/738; 714/733
(58) Field of Classification Search ................ 714/738, 714/733
See application file for complete search history.

(56) References Cited

U.S. PATENT DOCUMENTS

| 4,503,536 | A |   | 3/1985  | Panzer                       |
|-----------|---|---|---------|------------------------------|
| 4,513,318 | A | * | 4/1985  | Wilensky et al. ...... 348/181 |
| 4,554,636 | A | * | 11/1985 | Maggi et al. ......... 702/118 |
| 4,670,782 | A | * | 6/1987  | Harshbarger et al. ... 348/183 |
| 4,813,043 | A | * | 3/1989  | Maeno et al. ......... 714/738 |
| 4,881,229 | A |   | 11/1989 | Kaltbeitzel et al.           |
| 4,974,184 | A |   | 11/1990 | Avra                         |
| 5,055,928 | A | * | 10/1991 | Klingelhofer ......... 348/181 |
| 5,197,062 | A |   | 3/1993  | Picklesimer                  |
| 5,202,978 | A |   | 4/1993  | Nozuyama                     |
| 5,383,177 | A |   | 1/1995  | Tateishi                     |
| 5,392,314 | A |   | 2/1995  | Wolf                         |
| 5,414,713 | A |   | 5/1995  | Waschura et al.              |
| 5,444,716 | A | * | 8/1995  | Jarwala et al. ....... 714/727 |
| 5,450,416 | A |   | 9/1995  | Bowcutt et al.               |
| 5,450,425 | A |   | 9/1995  | Gunn et al.                  |
| 5,479,414 | A | * | 12/1995 | Keller et al. ......... 714/726 |
| 5,485,470 | A |   | 1/1996  | Yamada                       |
| 5,497,377 | A |   | 3/1996  | Muto et al.                  |

(Continued)

OTHER PUBLICATIONS

*Digital Visual Interface DVI, Revision 1.0,* Apr. 2, 1999, The Digital Display Working Group.

(Continued)

*Primary Examiner*—Joseph D. Torres
(74) *Attorney, Agent, or Firm*—Darby & Darby PC; Matthew M. Gaffney

(57) ABSTRACT

A test system includes a test data generator to provide test data (e.g., a test pattern) to a subject circuit (e.g., a digital television video circuit). The test data is functionally to verify the subject circuit. The functional verification of the subject circuit is performed utilizing an output of the subject circuit generated responsive to the test data in accordance with an operational functionality of the subject circuit. The test data generator is also coupled to provide the test data to a built-in self-test (BIST) circuit so as to enable the built-in self-test circuit to receive the test data.

16 Claims, 18 Drawing Sheets

U.S. PATENT DOCUMENTS

| | | | |
|---|---|---|---|
| 5,802,105 | A | 9/1998 | Tiedemann, Jr. et al. |
| 5,920,340 | A | 7/1999 | Man et al. |
| 5,936,900 | A | 8/1999 | Hii et al. |
| 5,991,909 | A * | 11/1999 | Rajski et al. ............... 714/729 |
| 6,073,263 | A | 6/2000 | Arkin et al. |
| 6,122,757 | A | 9/2000 | Kelley |

OTHER PUBLICATIONS

"Genlinx GS9022 Digital Video Serializer Data Sheet", Gennum Corporation, Revision Aug. 1997, doucment No. 521-42-01.

SMPTE 259M—1997: for Television—10 Bit 4:2:2 Component and 4fsc NTSC Component Digital Singals—Serial digital Interface Scopes of SMPTE Standards, Aug. 14, 2000, http//www.smpte.org/stds/stscope.html.

SMPTE 292M—1998: for Television—Bit-Serial Digital Interface for High Definition Television Systems Scopes of SMPTE Standards, Aug. 14, 2000, http//www.smpte.org/stds/stscope.html.

* cited by examiner

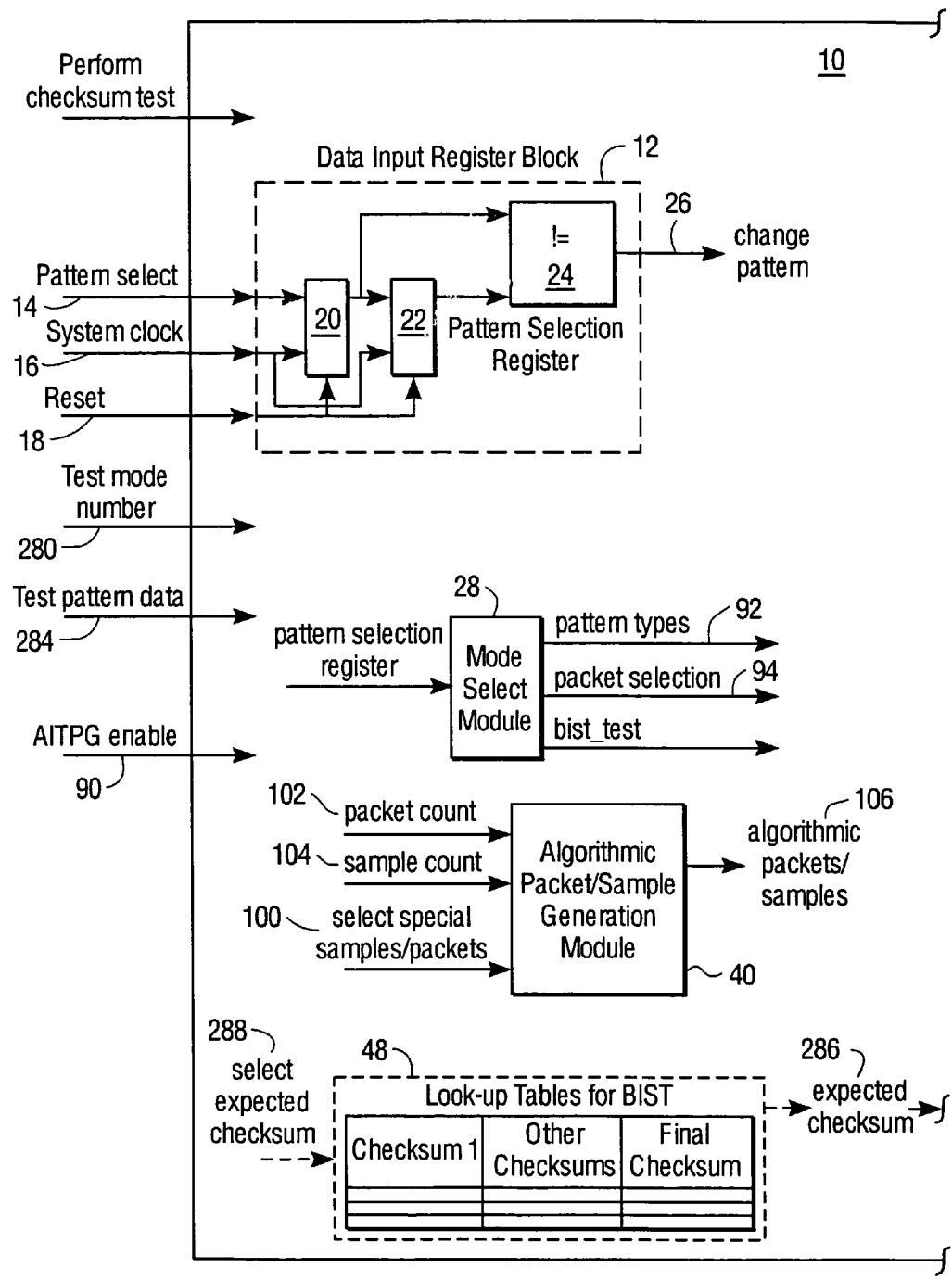
FIG. 1A　　　　　　　　Fig. 1B →

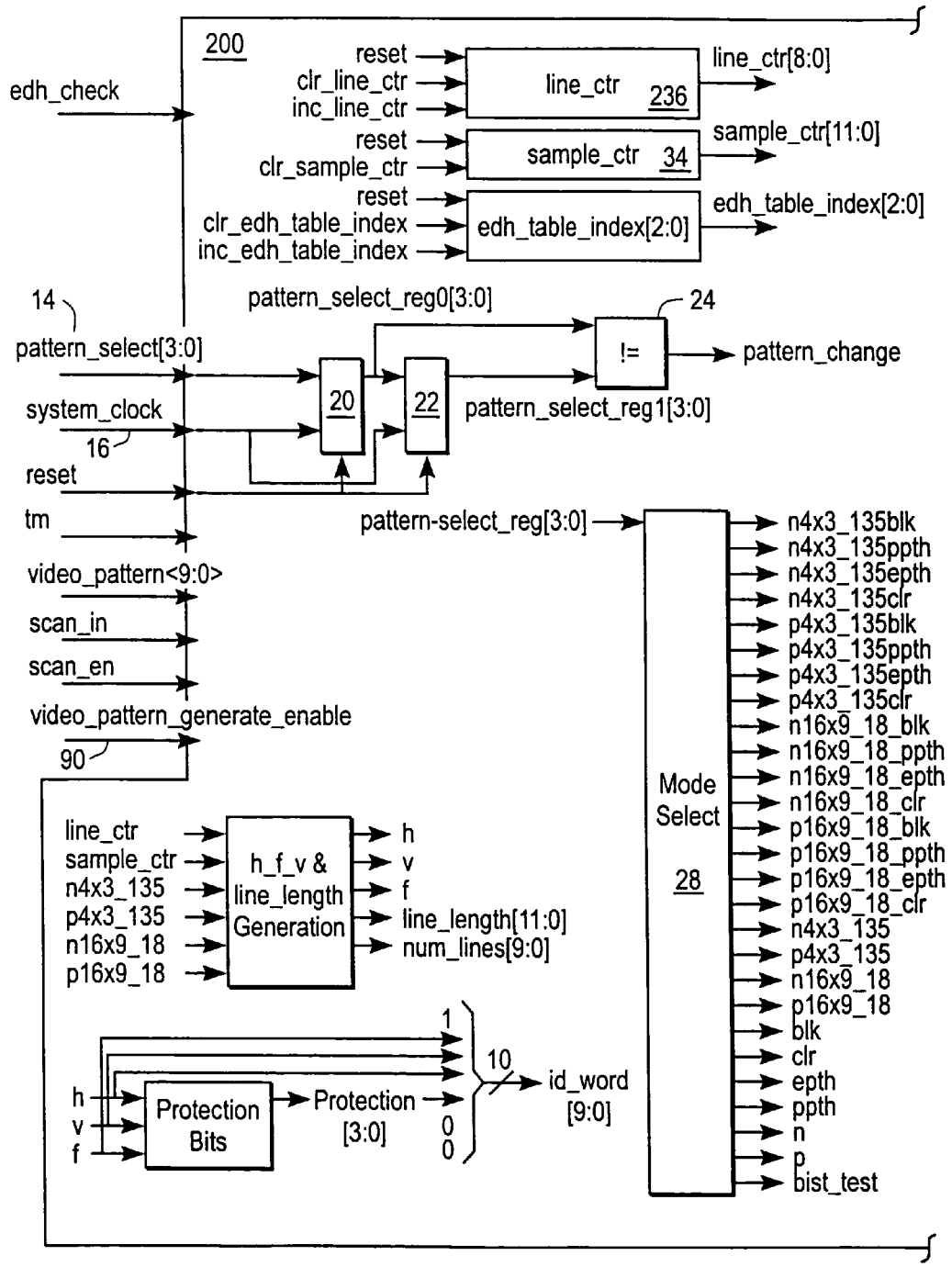
FIG. 4A     Fig. 4B →

| | Colour Table ~ 232 | | | 220 |
|---|---|---|---|---|
| 35 | 0x200 | | | |
| 36 | 0x3ac | | | |
| 37 | 0x200 | n4x3_135 → | 43 | |
| 38 | 0x3ac | p4x3_135 → | 43 | |
| 39 | ---- | p16x9_18 → | 58 | |
| 40 | 0x0ac | n16x9_18 → | 58 | |
| 41 | 0x284 | | | |
| 42 | 0x234 | n4x3_135 → | 45 | |
| 43 | 0x284 | p4x3_135 → | 45 | |
| 44 | ---- | p16x9_18 → | 60 | |
| 45 | 0x270 | n16x9_18 → | 60 | |
| 46 | 0x20c | | | |
| 47 | 0x0ac | n4x3_135 → | 45 | |
| 48 | 0x20c | p4x3_135 → | 45 | |
| 49 | ---- | p16x9_18 → | 60 | |
| 50 | 0x120 | n16x9_18 → | 60 | |
| 51 | 0x1c0 | | | |
| 52 | 0x0e4 | n4x3_135 → | 45 | |
| 53 | 0x1c0 | p4x3_135 → | 45 | |
| 54 | ---- | p16x9_18 → | 60 | |
| 55 | 0x2dc | n16x9_18 → | 60 | |
| 56 | 0x14c | | | |
| 57 | 0x318 | n4x3_135 → | 45 | |
| 58 | 0x14c | p4x3_135 → | 45 | |
| 59 | ---- | p16x9_18 → | 60 | |
| 60 | 0x18c | n16x9_18 → | 60 | |
| 61 | 0x104 | | | |
| 62 | 0x350 | n4x3_135 → | 45 | |
| 63 | 0x104 | p4x3_135 → | 45 | |
| 64 | ---- | p16x9_18 → | 60 | |
| 65 | 0x350 | n16x9_18 → | 60 | |
| 66 | 0x088 | | | |
| 67 | 0x1c8 | n4x3_135 → | 45 | |
| 68 | 0x088 | p4x3_135 → | 45 | |
| 69 | ---- | p16x9_18 → | 60 | |
| 70 | 0x200 | n16x9_18 → | 60 | |
| 71 | 0x040 | | | |
| 72 | 0x200 | n4x3_135 → | 47 | |
| 73 | 0x040 | p4x3_135 → | 47 | |
| 74 | ---- | p16x9_18 → | 62 | |
| | | n16x9_18 → | 62 | |

← Fig. 5A    FIG. 5B    Fig. 5C →

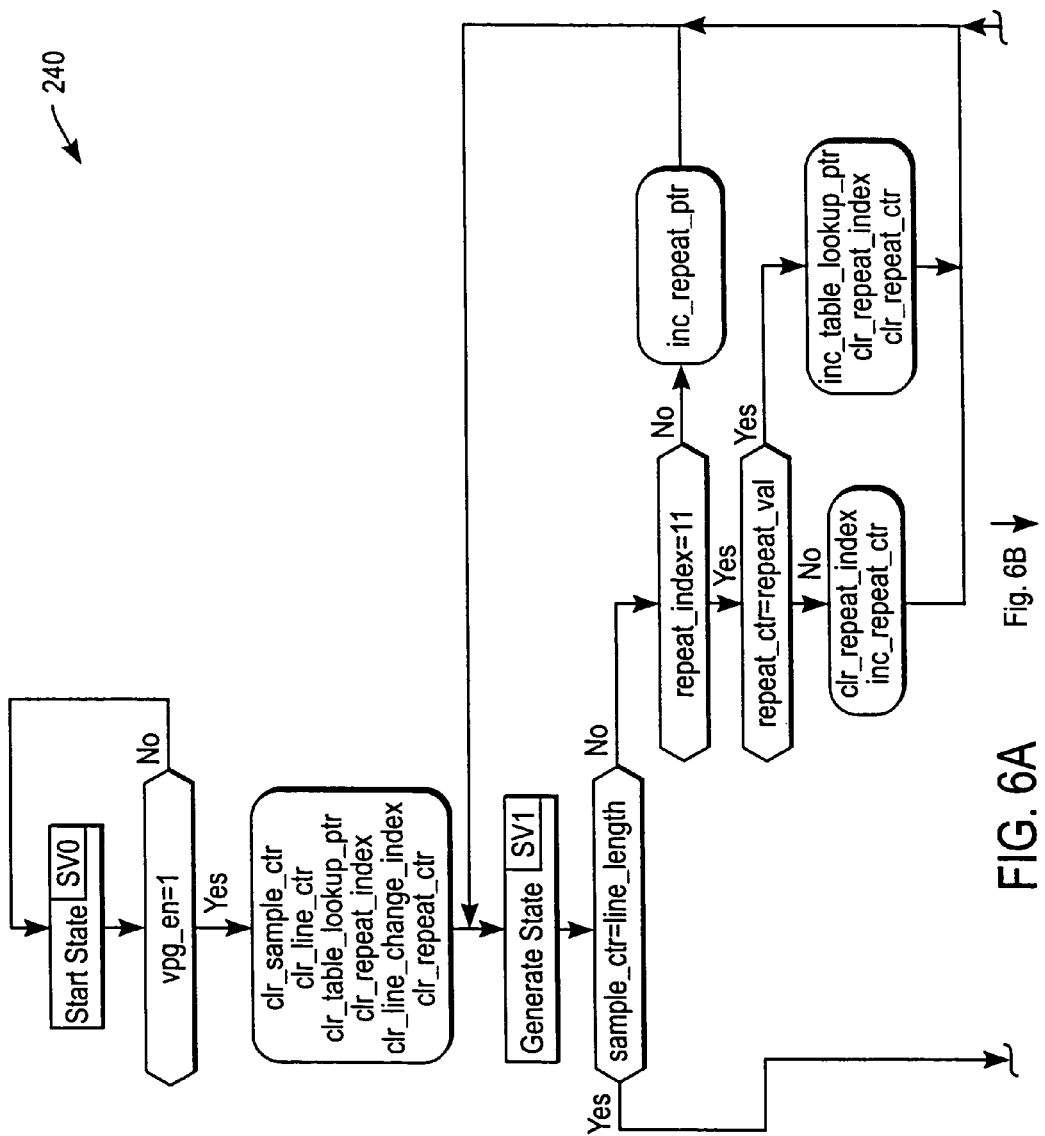

US 7,062,696 B2

ALGORITHMIC TEST PATTERN GENERATOR, WITH BUILT-IN-SELF-TEST (BIST) CAPABILITIES, FOR FUNCTIONAL TESTING OF A CIRCUIT

The present application claims the benefit of the filing date of provisional U.S. patent application No. 60/176,434 filed Jan. 14, 2000.

FIELD OF THE INVENTION

The present invention relates generally to the field of circuit testing and, more specifically, to an algorithmic test pattern generator, and with built-in self-test capabilities, for the functional testing of a circuit within, for example, a communications device.

BACKGROUND OF THE INVENTION

One of the most expensive and time-consuming aspects of integrated circuit design and manufacture is the production test phase. Upon fabrication, each device should be fully tested before it can be sold. Coarse tests are used to filter grossly failing devices. More detailed tests are typically required to detect devices that operate largely as designed, but are still not fully functional. As circuits become more complicated, it is becoming increasingly difficult adequately to exercise (e.g., control) and monitor (e.g., observe) all the internal parts of a circuit from outside a device within which such a circuit operates. To address these difficulties, methods to perform built-in self-test (BIST) have been developed. To achieve BIST, elements are added internally to a circuit design for the exclusive purpose of testing the circuit. At a test stage, these blocks are exercised and after a known period of time, a determination can be made if sections of the circuit being controlled operate in an intended manner and with intended functionality.

The testing of circuits in communication devices is particularly challenging in view of the nature of data processed by such communication devices. To illustrate this point, it is useful to consider the functioning of a typical communications system. At a first stage, a communications system acquires data (e.g., a message) and modulates it. A second stage encodes the acquired data for transmission over a communications channel. At the other end of the communications channel, a receiving communications system decodes the channel information and demodulates this data to recover the original message. To fully and properly test a complex communications device, long streams of detailed and exact data, which accurately represent data that may be transmitted and/or received by the communications device over a communications channel, should be supplied to a communications device during the test phase. Typically, in the prior art, specialized equipment specific to each type of system and communication channel is necessary both to supply such test data and determine if a recovered message is correct. When communications devices form part of a printed circuit board (PCB), these devices may be difficult to access directly as the input data is typically supplied to the communications device via a path including several other integrated circuits.

Consider further that in many cases, the complete data streams or packets must be supplied to a communications device before a transmitter thereof performs any valid operations. Such data streams can be very long, and even sometimes exceed the storage capability of standard test equipment.

Additionally, there is also often a need to check if an entire product incorporating a communications device is working properly and supports certain standards. In such cases, a quick and simple test is often all that is required to test digital video applications (e.g., SMPTE-259M, SMPTE-292M, and the Digital Video Interface (DVI)).

SUMMARY OF THE INVENTION

A method of generating test data to functionally verify a circuit that detects a data selection signal and, responsive to the data selection signal, presents test data to verify the circuit wherein the presenting of the test data includes composing the test data utilizing a combination of algorithmically generated data and stored data.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings, in which like references indicate similar elements and in which:

FIG. 1A through 1C (FIG. 1) is an embodiment of an algorithmic test pattern generator that includes built-in self-test (BIST) capabilities.

FIG. 4A through 4C (FIG. 4) is a block diagram illustrating an exemplary internal structure of a pattern generator for application in a broadcast quality serial digital television video system.

FIG. 5A through 5C (FIG. 5) illustrates exemplary sample values that may be utilized by the generator illustrated in FIG. 4 to test different component standards.

FIG. 6A through 6B (FIG. 6) is a flowchart illustrating an exemplary programmed flow sequence that may be implemented by the generator illustrated in FIG. 4.

DETAILED DESCRIPTION

An algorithmic test pattern generator, with built-in self-test (BIST) capabilities, to verify a circuit and a system including such a circuit, and a method of operating such an algorithmic test pattern generator, are described. In the following description, for purposes of explanation, numerous specific details are set forth in order to provide a thorough understanding of the present invention. It will be evident, however, to one skilled in the art that the present invention may be practiced without these specific details.

An exemplary embodiment of algorithmic test pattern generator that may be utilized as an internal data pattern generator for multiple communications standards, for which fully valid data streams may be algorithmically generated, is disclosed. The test pattern generator also accepts error correction data from an internal control block that is utilized to implement built-in self-test (BIST) functionality. In one embodiment, the present invention allows a test mode to be implemented for a device wherein the device is clocked at a fully operational speed.

The present invention finds particular application, but is not limited to, the testing of circuits for utilization in communication systems. Typically, communication systems and channels communicate data either as streams or packets of data. In streamed systems, there is a continuous transmission of data. In packet systems, data is fractured into groups. The present invention contemplates generating test data for testing both streamed systems and packet systems. Specifically, for streamed systems, the present invention, in one embodiment, utilizes a finite portion of a stream and repeats it. For packets systems, the present invention may, in one embodiment, generate one or more packets and apply such packets to the communications system.

Figure 1B:
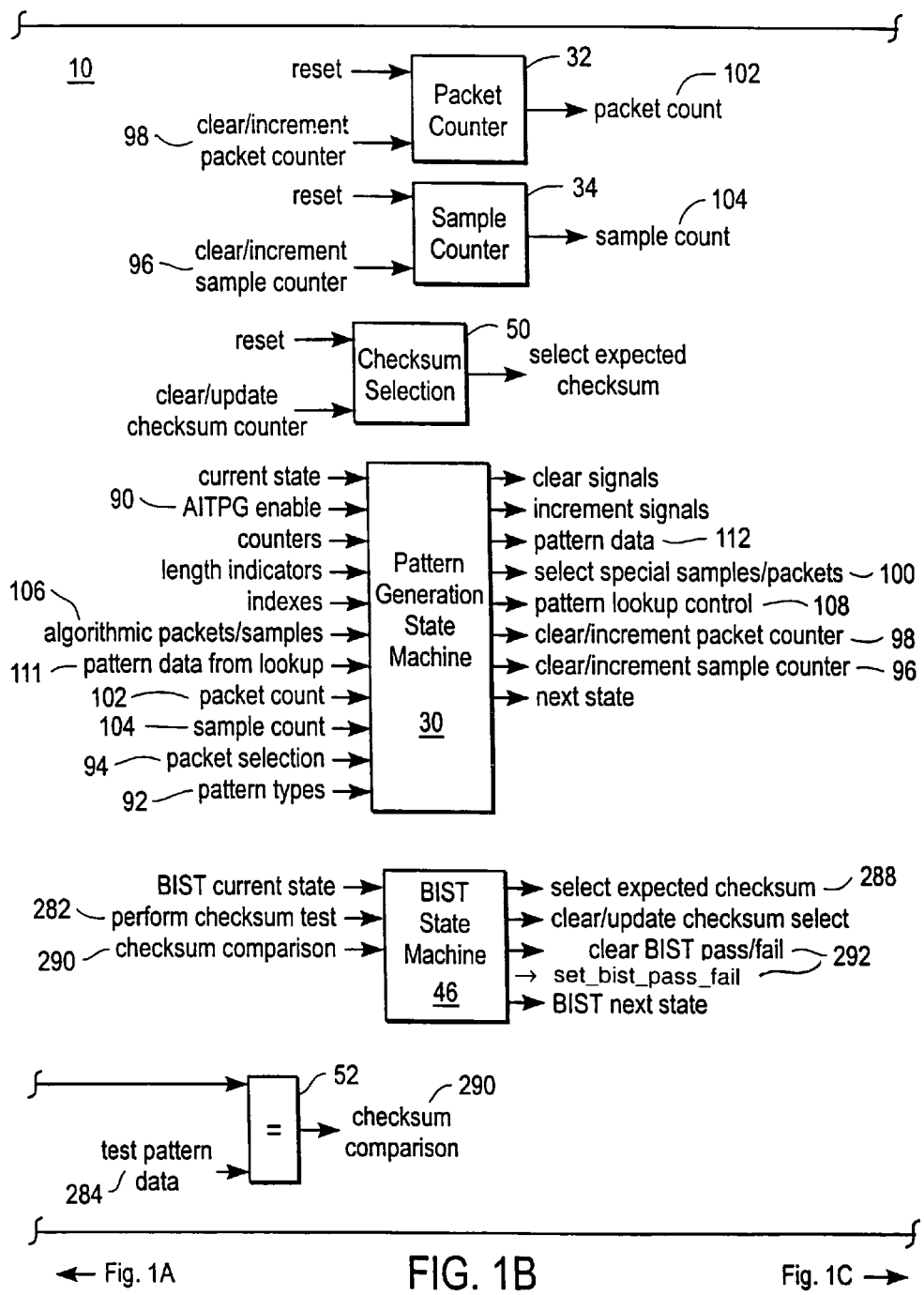
Figure 1C:
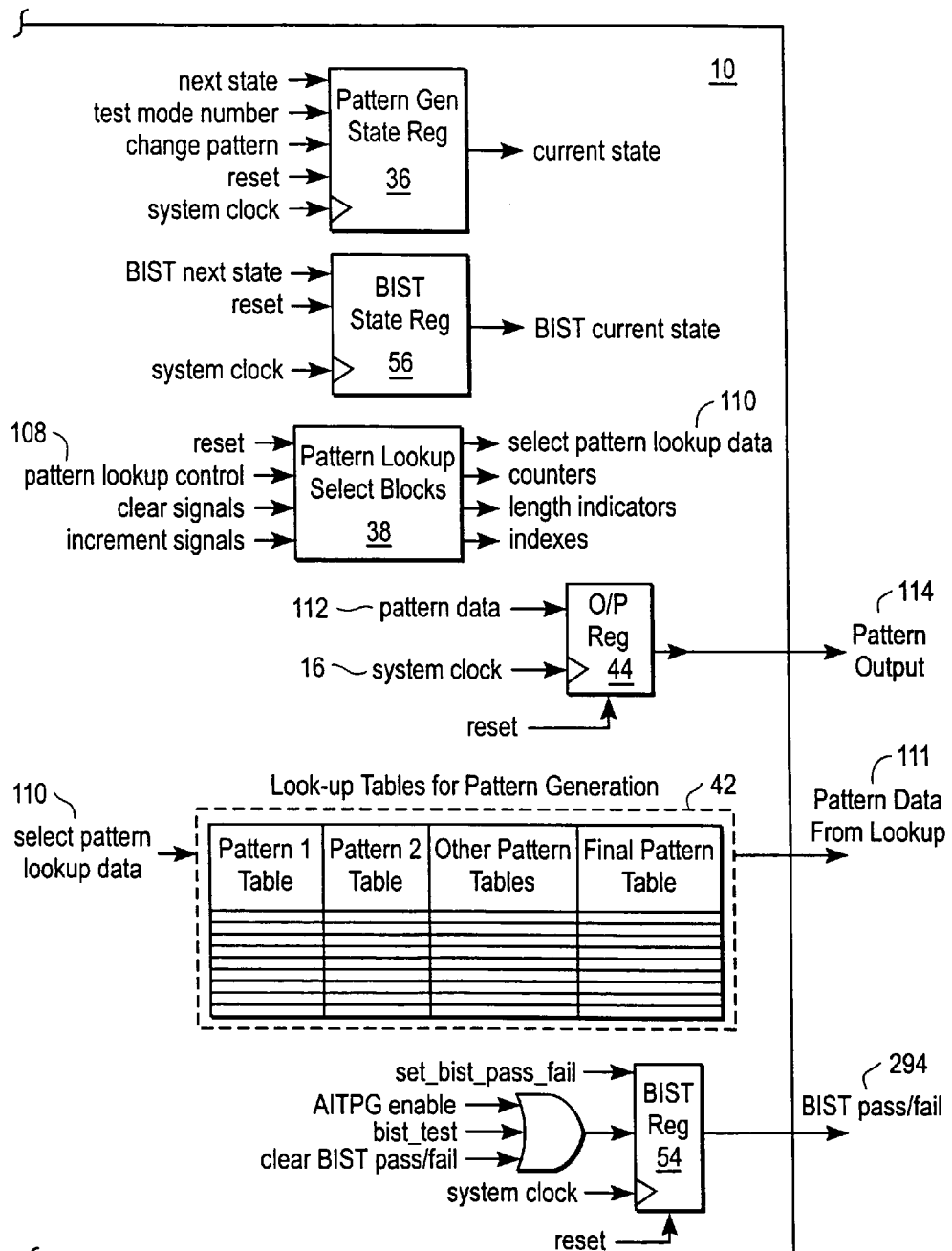

FIG. 1 is a block diagram illustrating an algorithmic test pattern generator 10, according to an exemplary embodiment of the present invention, which also includes built-in self-test (BIST) capabilities. A data input register block 12 is shown to receive a pattern select signal 14, a system clock 16 and a reset signal 18. The register block 12 includes two storage registers namely a buffer register 20 and a pattern selection register 22, as well as a pattern change detector 24, from which is output a change pattern signal 26.

Pattern generation components of the generator 10 including: a mode select module 28, a pattern generation state machine 30, a packet counter 32, a sample counter 34, a pattern generator state register 36, pattern lookup select blocks 38, an algorithmic packet/sample generation module 40, lookup tables for pattern generation 42, and a pattern output register 44.

BIST components of the generator 10 include a BIST state machine 46, lookup tables for BIST 48, a checksum selection module 50, a checksum comparator 52, a BIST register 54, and a BIST state register 56.

Operation of each of these components will now be discussed in further detail below with references to flow charts.

Generation of Algorithm and Stored Portions

Figure 2:
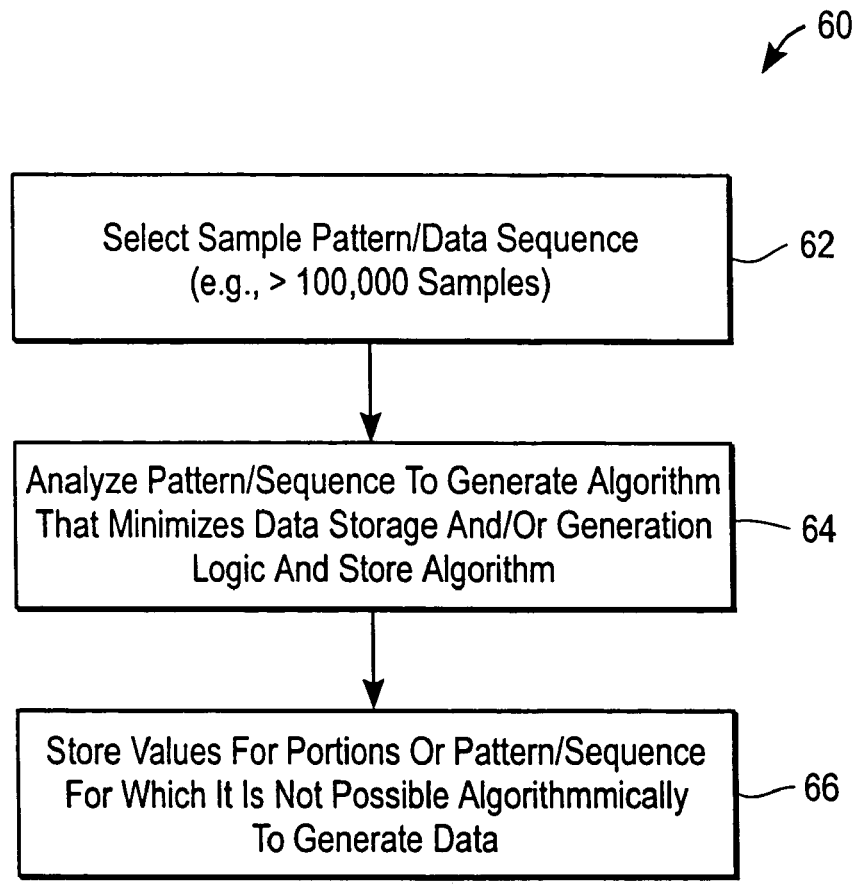
FIG. 2 is a flowchart illustrating an exemplary method by which a pattern generator state machine may be programmed.

FIG. 2 is a flowchart illustrating, at a high-level, an exemplary method 60 by which a pattern generation state machine 30 may be programmed, and lookup tables for pattern generation 42 populated. At block 62, a suitable data pattern or data sequence (e.g., >100,000 samples) is selected. For the testing of many communications standards, either a number of sequence formats of the relevant standard exist, or different data sequences are required to fully exercise a device to test for standards compliance. For such standards, a single generator 10 may be implemented and the lookup tables 42 may be utilized to supply of the generator 10 with information required to generate a full data sequence for multiple test patterns.

At block 64, the sample test pattern (or sequence) is analyzed to generate an algorithm that minimizes the data storage or generation logic (e.g., the algorithmic packet/output generation module 40). Test pattern data generally exhibits a high degree of regularity or contains repeated sequences that are easily recognized by inspection. Alternatively, these repetitive data sequences can be defined within a standards document issued for such test purposes by a standards organization such as the American National Standards Institute (ANSI) or, as in the present case concerning television video test signals, the Society of Motion Picture and Television Engineers (SMPTE). In one example; one line of video picture data is comprised of 1,716 10-bit-long, data sample words.

These samples include 858 representing the picture luminance (Y) value, 429 each representing the two different color difference component (Cr and Cb) values for a total of 1,716 samples organized in a repetitive pattern, Y, Cb, Y, Cr, etc. Of the total number of samples, 1,440 samples comprise the active picture line data: 720 luminance (Y) samples and 360 each of the color difference samples (Cr and Cb). These are similarly interleaved, Y, Cb, Y, Cr, etc. The remaining 276 samples comprise other repetitive sequences of data that are used for identification of the beginning and ending of the line or contain samples representing the horizontal blanking interval portion of the total video line's duration.

Specifically, a line of active picture chrominance and luminance data samples representative of one such test pattern is comprised of the Y, Cb, Y, Cr sequence: 300, 198, 300, 198 . . . (hexadecimal representation) a total of 360 times. A sequence of data samples, 3FF, 000, 000, XYZ occurs twice (where XYZ may be one of eight unique data words used for identification purposes). The remainder of the 268 data samples comprise a sequence: 040, 200, 040, 200, . . . , representing the horizontal blanking interval data.

An algorithm may be programmed into the algorithmic packet/sample generation module 40 discussed above (with reference to FIG. 1). Typically, data patterns or sequences within a test pattern which have long repeated sequences, or which may be easily generated algorithmically (as discussed just above), may be very efficiently "compressed" by way of algorithmic representation.

At block 66, values are stored in the lookup tables 42 for points in the data pattern or sequence where it is not possible to algorithmically generate data, with an appropriate lookup or an index, so as to enable recall of such values for regeneration of a test pattern.

Algorithmic Generation of Test Data

Figure 3:
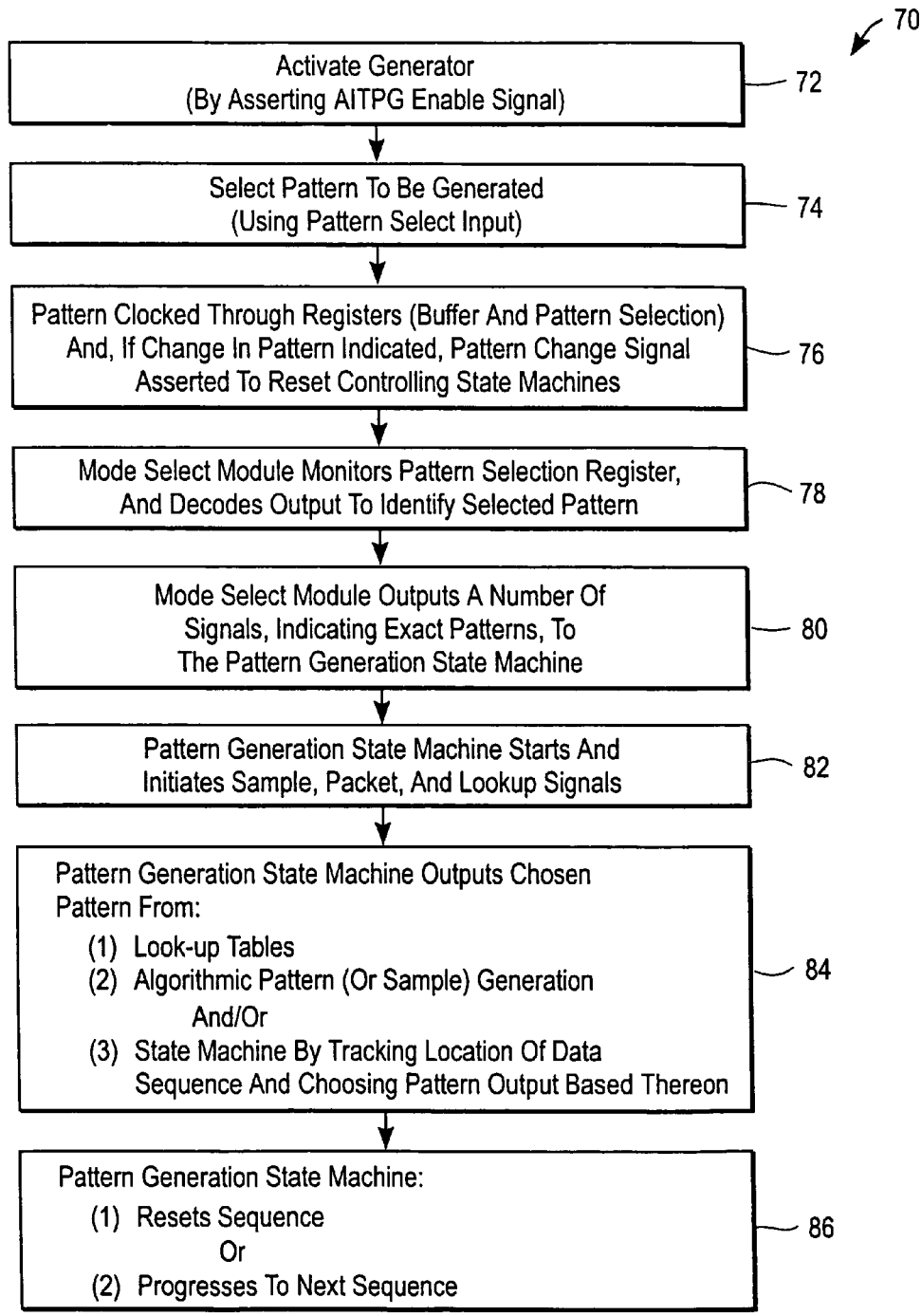
FIG. 3 is a flowchart illustrating an exemplary method of generating test data to functionally verify a circuit.

FIG. 3 is a flowchart illustrating a method 70, according to an exemplary embodiment of the present invention, of generating test data to functionally verify a circuit. In one embodiment, such a circuit may be included within an integrated circuit device for the processing and transmission of digital television signals. It will be appreciated that the present invention is not limited to such an application. Further, while the test data is below described as comprising a "test pattern", it will be appreciated that this test pattern may constitute a stream of data or packets of data.

The method 70 commences at block 72 with the activation of the generator 10, for example by the assertion of an enable signal 90 illustrated in FIG. 1. At block 74, where the generator 10 is capable of generating multiple patterns, a pattern to be generated by the generator 10 is selected utilizing, for example, the pattern select signal 14. As described above, the pattern select signal 14 provides input to the data input register block 12. At block 76, the pattern selection signal 14 is clocked through the buffer register 20 on a first clock signal. The pattern selection register 22 may store an indication of a previously selected pattern. The buffer register 20 and the pattern selection register 22 both provide input to the pattern change detector 24, thus allowing the detector 24 to detect a change in pattern selection. Responsive to a detection of a change in pattern selection, the pattern change detector 24 assets a change pattern signal 26, which then operates to reset to the pattern generation state machine 30.

At block 78, the mode select module 28 monitors the pattern selection register 22, and decodes its output to determine a selected test pattern to be generated. At block 80, the mode select module 28 outputs a number of signals indicating the exact pattern(s) to be generated, to the pattern generation state machine 30. These signals included, for example, a pattern type signal 92 and/or a packet selection signal 94.

At block 82, the pattern generation state machine 30 starts and initiates sample, packets and lookup signals. For example, these signals may include a clear/increment sample counter signal 96, a clear/increment packet counter signal 98 and a selected special samples/packets signal 100. These signals are input to the packet counter 32, which outputs the packet count signal 102, and to the sample counter 34 that outputs a sample count signal 104. The packet count signal 102 and the sample count signal 104 are then shown to again be fed back as input to the pattern generation state machine 30, so as to enable the state machine 30 to track in the location in a test pattern data sequence and to appropriately transition between states according to its programming.

The pattern generation state machine 30 tracks the location in the test pattern data sequence, utilizing the signals described above, and decides which data is to be supplied next as part of the output test pattern data sequence. At one end of such a test pattern data sequence, the pattern generation state machine 30 resets the entire sequence, or progresses to a subsequent sequence. As described, the packet counter 32 and the sample counter 34 are utilized to track a location within the test pattern data sequence. It will be appreciated that, for particularly complex patterns, additional counters may be added to enable the state machine 30 to track a current location within a test pattern data sequence.

As also illustrated in FIG. 1, the algorithmic packet/sample generation module 40 also receives the packet count signal 102, the sample count signal 104, and the select special samples/packets signal 100 as input. The algorithmic packet/sample generation module 40 is a thus controlled by the pattern generation state machine 30, the packet counter 32, and the sample counter 34 to algorithmically generate data (i.e. algorithmic packet/samples 106) for input to the pattern generation state machine 30.

The pattern generation state machine 30 is also shown to output a pattern lookup control signal 108 to the pattern lookup select blocks 38 that, utilizing increment signals, output a selected pattern lookup data signal 110 that indexes into the lookup tables for pattern generation 42. The data from the lookup tables 42 is controlled by the pattern lookup select blocks 38 as more than one lookup table may be utilized for complex test pattern data streams. Pattern data 111 from the lookup tables 42 is provided as input to the pattern generation state machine 30. Typically, the lookup tables 42 content consists of the unique data samples, and not any patterns or data sequences as such. While, at various points within a test pattern data stream, special data sequences may be required, these are typically generated by the pattern generation state machine 30. Pattern data 111 or 114 may be subjected to additional processing such as filtering or dithering to create more complex test patterns.

From the above discussion, it will be appreciated that the pattern generation state machine 30 is able selectively to compose pattern data 112 (for output to the pattern output register 44) utilizing three data "inputs" or sources, namely the lookup tables 42, the algorithmic packet/sample generation module 40, and the state machine 30 itself. Accordingly, at block 84, the pattern generation state machine 30 outputs pattern data 112, as determined by state transitions programmed for the state machine 30, by combining pattern data received from the above named three sources by tracking a location in a data sequence, transitioning to an appropriate state, and selecting a pattern output based on the current state. The pattern data 112 is shown to be output to the pattern output register 44, which is clocked by the system clock 16 to output a test pattern 114.

At block 86, the pattern generation state machine 30, upon completion of the output of a test pattern data sequence, resets the sequence, or progresses to the next sequence.

Figure 4B:
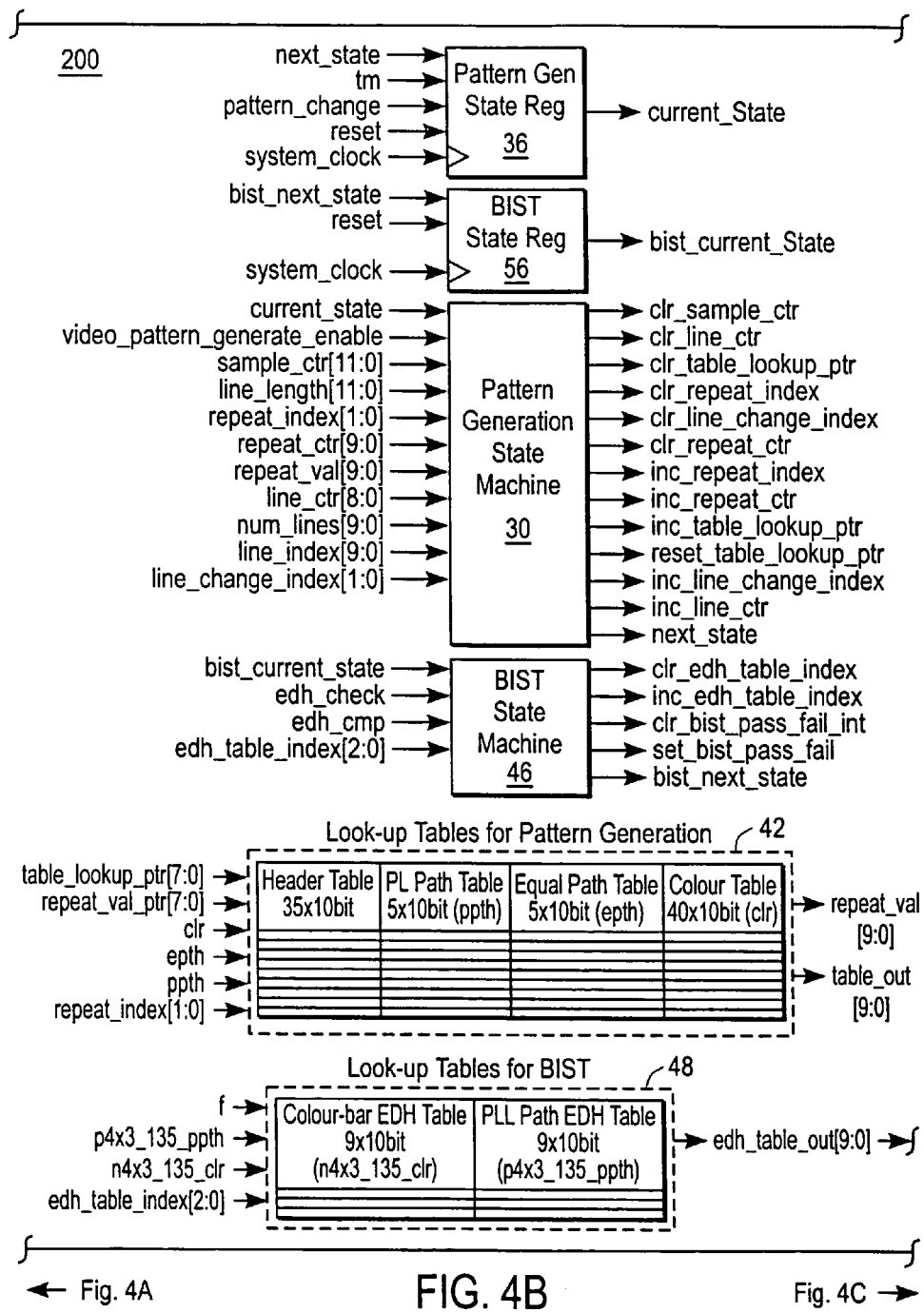
Figure 4C:
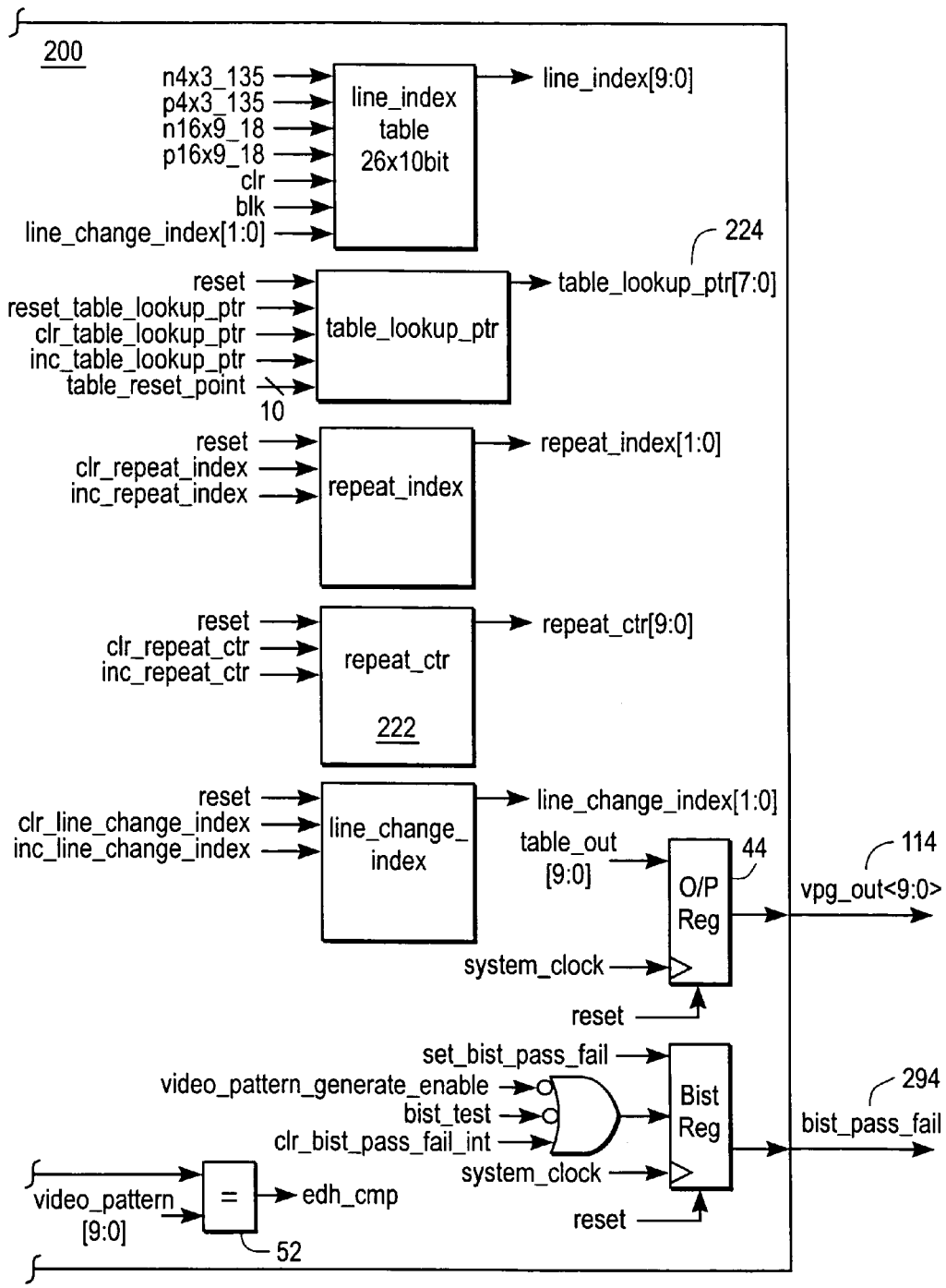

Exemplary Embodiment-Pattern Generator for Broadcast Quality Serial Digital Television Video FIG. 4 is a block diagram illustrating the internal structure of a pattern generator 200, according to exemplary embodiment of the present invention, for application in a broadcast quality serial digital television video system. The generator 200 includes components corresponding substantially to those of the generator 10 described above with reference to FIG. 1, and illustrates implementation details for this exemplary embodiment of the present invention. The generator 200 generates 16 different component video patterns for 525/625 line systems running at 13.5 megahertz and 18 megahertz luminance sampling frequencies.

In digital television video, broadcast quality test patterns suitable for testing digital television video systems and devices are typically required. The video raster (also termed a "frame") is synchronously reconstructed from stored 10-bit binary words, according to a preset sequence and timing. The sequencing is controlled by the preprogrammed pattern generation state machine 30. The timing for the state machine 30 is derived from an external system clock 16 (e.g., a high stability master clock source in host video equipment or a plant facility). The stored 10-bit binary words are the various data elements that are required to construct both the visual and nonvisual picture elements forming the raster. The picture raster consists of: (1) assemblages of picture element words forming the visible and nonvisible (timing and control) horizontal picture lines; (2) collections of picture lines organized into picture fields; and (3) two or more fields assembled and interlaced to form a picture frame (or raster). The picture elements comprise: (1) the timing reference signals (synchronized elements); (2) picture chrominance (color); and (3) luminance (brightness) sample values for every pixel; and (4) other non-visible or ancillary data element values.

The exemplary embodiment of the present invention illustrated in FIG. 4 organizes and builds, from a small number of stored digital words, a complete television video picture that can be used for testing and/or evaluation of digital television video processing equipment.

Figure 5A:
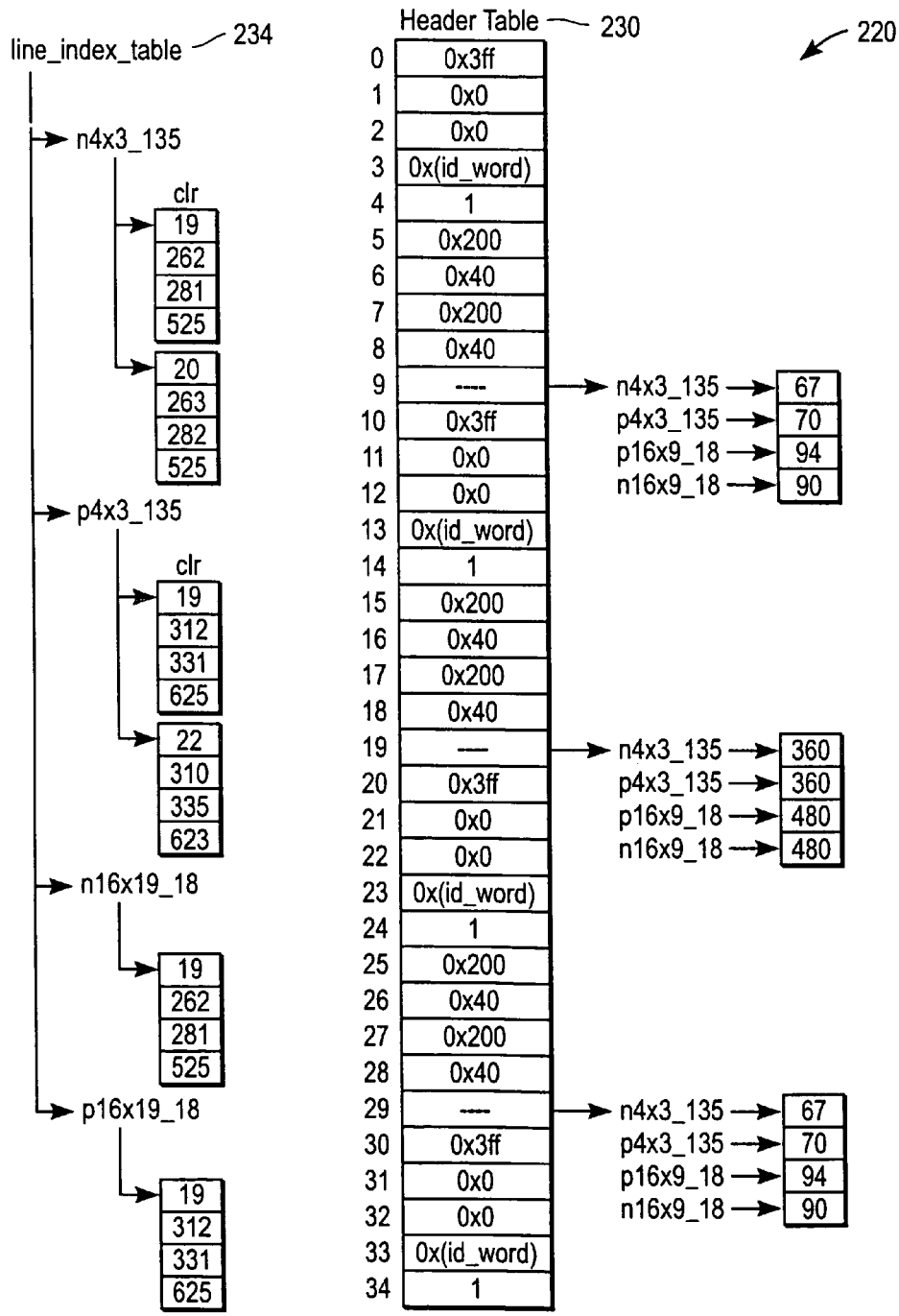
Figure 5C:
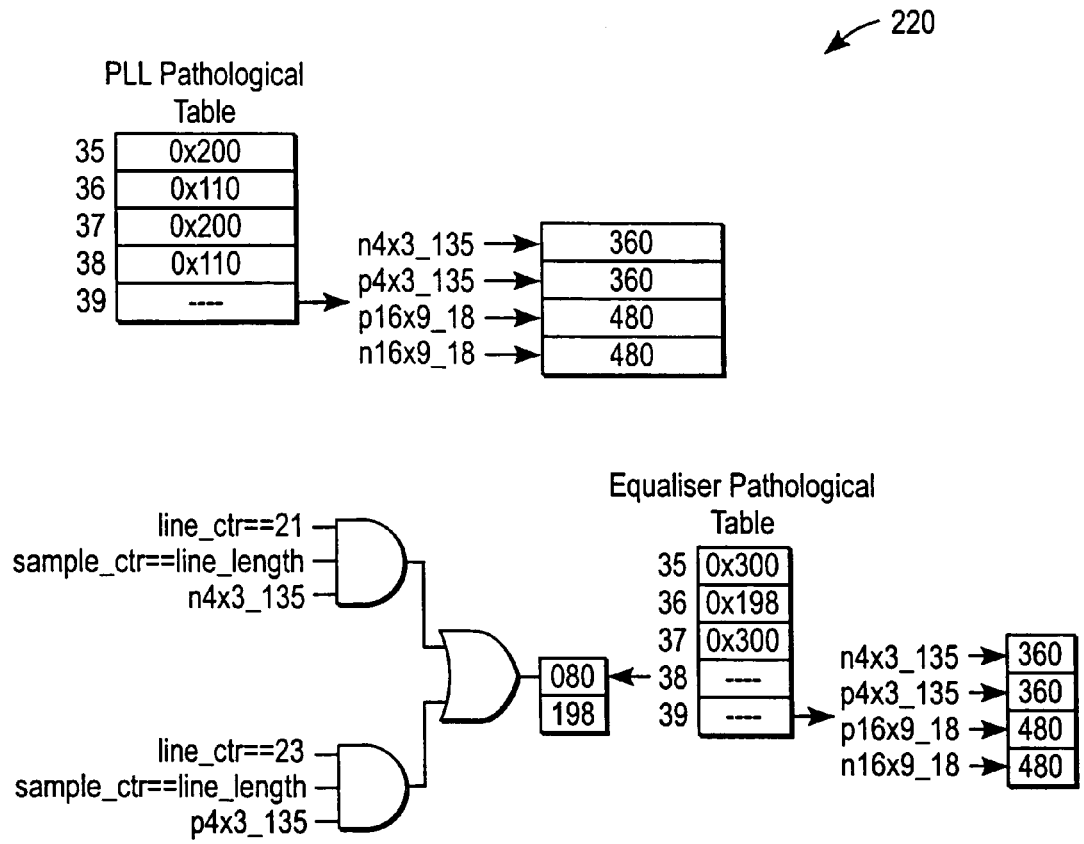

FIG. 5 illustrates exemplary sample values, contained in respective tables 220, that may be utilized by the generator 200 illustrated in FIG. 4 to test different component standards. Specifically, the format of the lines for each existing component video standards is somewhat similar, the most prominent difference being in the number of samples of active video information and horizontal blanking. Each of the tables illustrated in FIG. 5 is shown to be divided into five sample segments, so that each table has an integer multiple of five components. Each of the five segment sections holds four samples (i.e., the first four 10-bit words) that are the values that are transmitted, and a fifth "repeat" value that indicates to the pattern generation state machine 30 how many times the previous samples are to be repeatedly transmitted. A repeat counter 222, illustrated in FIG. 4, and keeps track of the number of times that the four samples have been transmitted. When the repeat counter 222 reaches the "repeat" value, then the pattern generation state machine 30 checks to see if the end of a line has been reached. If so, the generator 10 then determines whether the line is the same as the previous. If so, a table lookup pointer 224 resets back to the relevant position in the appropriate table 220, and the line transmission repeats. On the other hand, if the line determined by the pattern generation state machine 30 is to be different from the previous one, then the table lookup pointer 224 skips to the correct position in the relevant table 220, and starts generating test pattern data for a different line format.

In the exemplary embodiment of the generator 200 illustrated in FIG. 4, a maximum of two different line types for each pattern are provided. The first type, namely the vertical blanking line types, is common to all patterns and these values are stored in a header table 230. For the remaining line types, the color bars type is the most diverse, as there are different luminance/chrominance values for each color. Nonetheless, an exemplary color table 232 is shown to utilize only 40 locations. Other patterns may be simpler, with a single four sample pattern being repeated for the entire frame, except for the vertical blanking lines. A reference black pattern may be even simpler, as it is substantially the same as the vertical blanking pattern, and therefore no extra sample data is required for its generation. In FIG. 5, an exemplary line index table 234 indicates when the generator 200 should switch to and from transmitting vertical blanking lines to active video data lines. In FIG. 4, a line counter 236 is shown to track the number of lines transmitted, and compares a number of transmitted lines against the values in the line index table 234 to determine when to switch line types.

In summary, patterns for the four component standards discussed above exhibit substantial similarities, and only differ in the number of samples in the active video line or horizontal blanking. Accordingly, it is apparent from the tables 220 shown in FIG. 5 that only the repeat values differ in the various tables 220 for different standards. Of course there may be a number of exceptions, an example being the equalizer pathological pattern at the 27 megahertz rate.

Figure 6B:
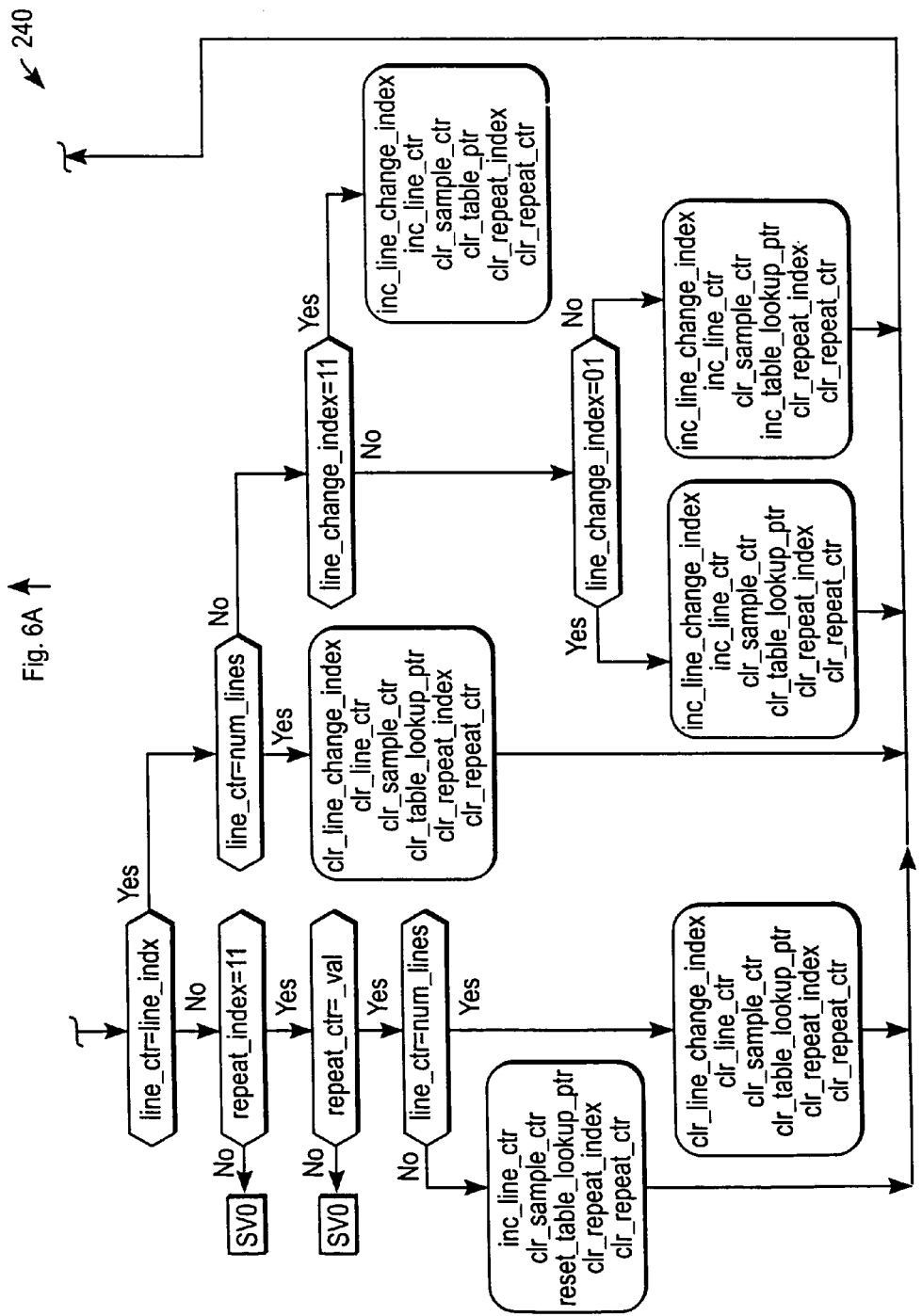

The execution of complex sequences of test data, utilizing reduced supplied data, is facilitated by the pattern generation state machine 30 that controls indexing of the pointers to ensure that the correct data is transmitted. FIG. 6 is a flowchart illustrating a programmed flow sequence 240, according to an exemplary embodiment of the present invention, that may be implemented by the generator 200 illustrated in FIG. 4.

Built-in-Self-Test (BIST) Functionality

As illustrated in FIGS. 1 and 4, the exemplary generators 10 and 200 include BIST components. Checksum generation and verification (signature analysis) are widely used to implement BIST. However, the data utilized to generate a checksum is typically provided from a pseudorandom generator, and may be of little direct relevance to a user. Further, most communication systems include some form of Error Detection and Handling (EDH) circuitry.

One embodiment of the present invention proposes utilizing such EDH circuitry, in conjunction with a generator 10 or 200 supplying input to the EDH circuitry, to perform a device or system test. Specifically, while a stream or packet of test data is propagated through a system, an error check is concurrently generated to perform a complete go/no-go test of the system. The output test data (e.g., a test pattern) of a generator 10 or 200 is, in one embodiment, introduced as input to a system hosting a device (e.g., a communications device). The test data is processed through the system, and concurrently through a checksum generator of the system, for a fixed interval, or number of words of the test data (e.g., a test pattern). The checksum generator utilizes a standard algorithmic process, implemented in hardware, to compute one or more checksums based on the test data being processed. The checksums computed by the checksum generator are then compared to pre-computed checksum values stored in a comparator system that is, in one embodiment, incorporated within a generator 10 or 200. Agreement between the computed and stored checksum values indicates that a host system, and a device included within such a host system (e.g., a communications device), are functioning correctly. Detection of one more incorrect checksums indicates a failure of one or more components of a host system.

The present invention is advantageous in that the operations performed by the BIST components and the pattern generation systems are run concurrently (or in parallel), and this allows the test data utilized to feed the BIST components also to be utilized for functional verification (e.g., by observation of an output of the circuit) of a circuit and/or a device or system incorporating such as circuit. In other words, one embodiment of the present invention contemplates that test data be concurrently provided to a circuit for the purposes of functional verification and to BIST components to facilitate built-in-self-test of a device or system.

Figure 7:
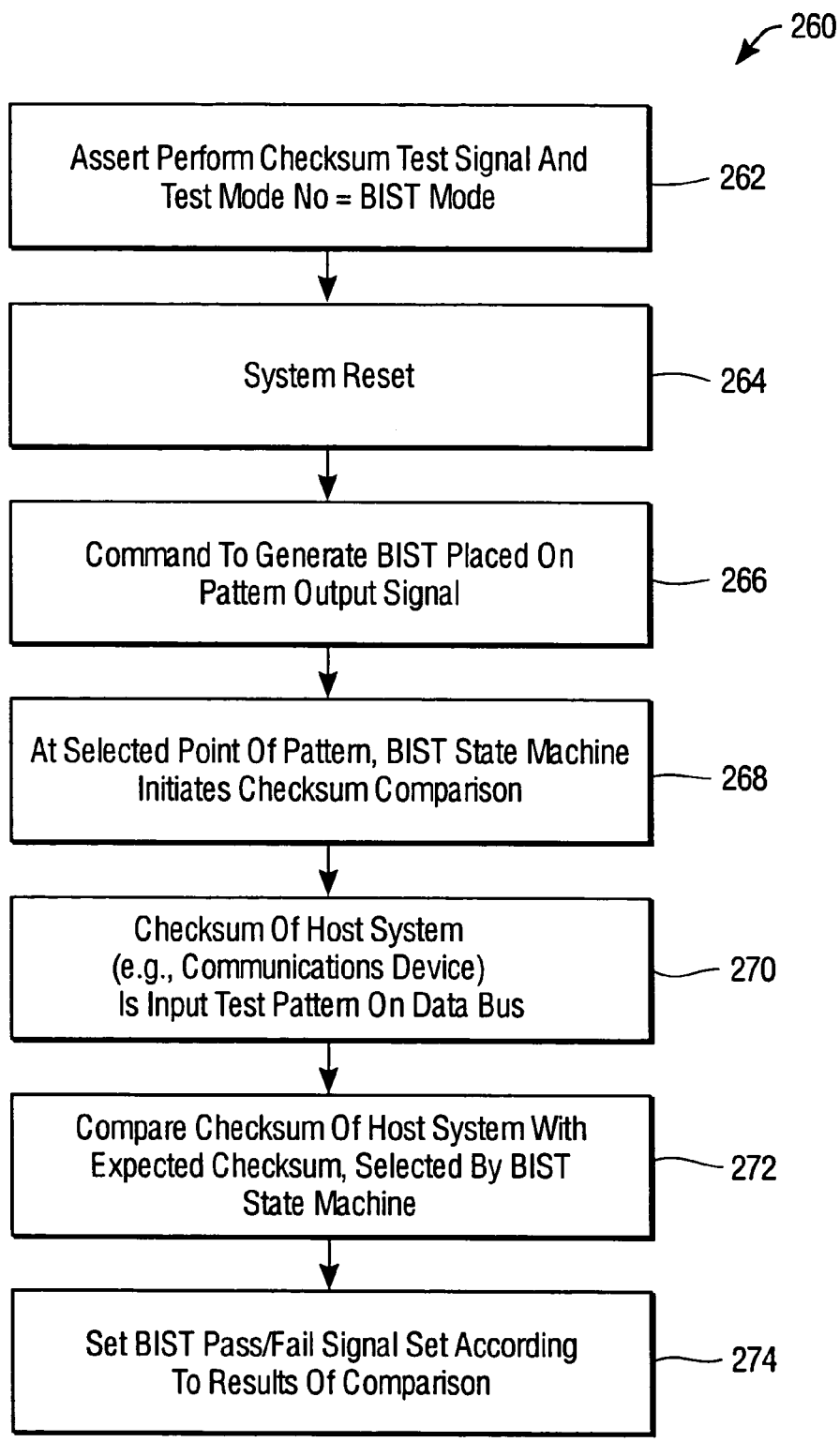
FIG. 7 is a flowchart illustrating an exemplary method of performing BIST operation.

FIG. 7 is a flowchart illustrating a method 260, according to an exemplary embodiment of the present invention, of performing a BIST operation, the BIST operation being performed concurrently with a functional verification of a circuit or device.

The method 260 assumes that a circuit is placed in a BIST mode by assertion of an appropriate test mode number input signal 280, indicated in FIG. 1. The method 260 then commences at block 262 with the assertion of a perform checksum test signal 282, which is input to the BIST state machine 46. The generator 10 is reset at block 264, responsive to the assertion of the perform checksum test signal 282, and a command to perform a built-in self-test is placed on the pattern output signal 114 at block 266. The command is a signal that indicates data being returned has the checksum in this position for comparison. At selected points in the test data output as the pattern output signal 114 (e.g., at the end of a sequence), the BIST state machine 46 initiates a checksum comparison, as indicated at block 268 in FIG. 7. Specifically, the checksum as output from a device or system under test is presented as an input on a test pattern data bus 284, shown in FIG. 1, at block 270 and compared with an expected checksum 286 retrieved from the lookup tables for BIST 48 at block 272. The expected checksum 286 is output from the lookup tables 48 responsive to the assertion of a selected expected checksum signal 288 generated by the BIST state machine 46. The expected checksum 286 and the test pattern data retrieved from the bus 284 are shown in FIG. 1 to be input into a comparator 52, which outputs a checksum comparison signal 290 to the BIST state machine 46.

At block 274, the BIST state machine 46, responsive to the checksum comparison signal 290, asserts set/clear BIST pass/fail signals 292 that provides input to the BIST register 54 that in turn outputs a BIST pass/fail signal 294.

Referring now specifically to the exemplary generator 200 illustrated in FIG. 4, this exemplary digital video television embodiment is illustrated to have a specific implementation of the built-in self-test (BIST) component structure illustrated in FIG. 1. The BIST components illustrated in FIG. 4 allow a comprehensive checking of a digital video television system without the need for expensive test equipment. Specifically, a system under test may utilize two test patterns, supplied by the generator 10 as pattern output signals 114, as a data source. The system under test, utilizing incorporated EDH circuitry, generates EDH cyclic redundancy check (CRC) check words associated with this input data. The generated check words are then compared against the computed and stored values (i.e., expected checksums) in a manner described above to determine whether the system under test is operating as expected. If the checksums match, the BIST pass/fail signal 294 is set to "1", indicating a successful BIST operation. If this signal is not asserted for a predetermined time period after initiating the BIST operation, then the system under test is deemed to be operationally faulty.

Figure 8:
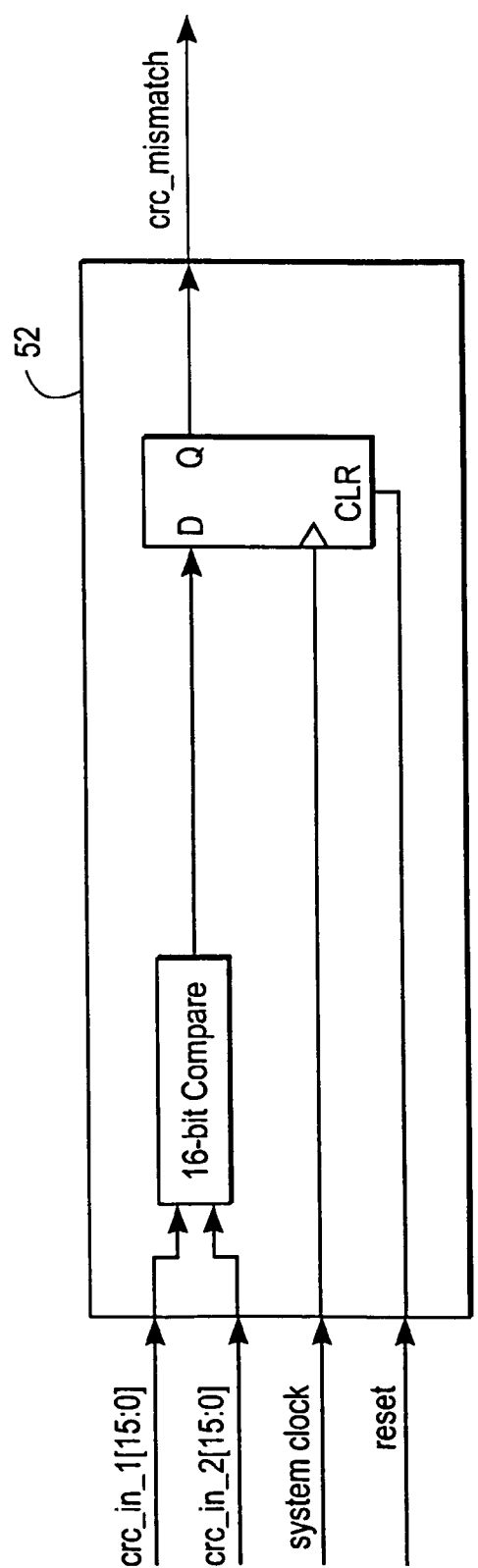
FIG. 8 is a block diagram illustrating details regarding an exemplary comparator system.

FIG. 8 is at block diagram illustrating a further details regarding an exemplary comparator system 52 that may be utilized to implement the exemplary embodiment described immediately above.

Figure 9:
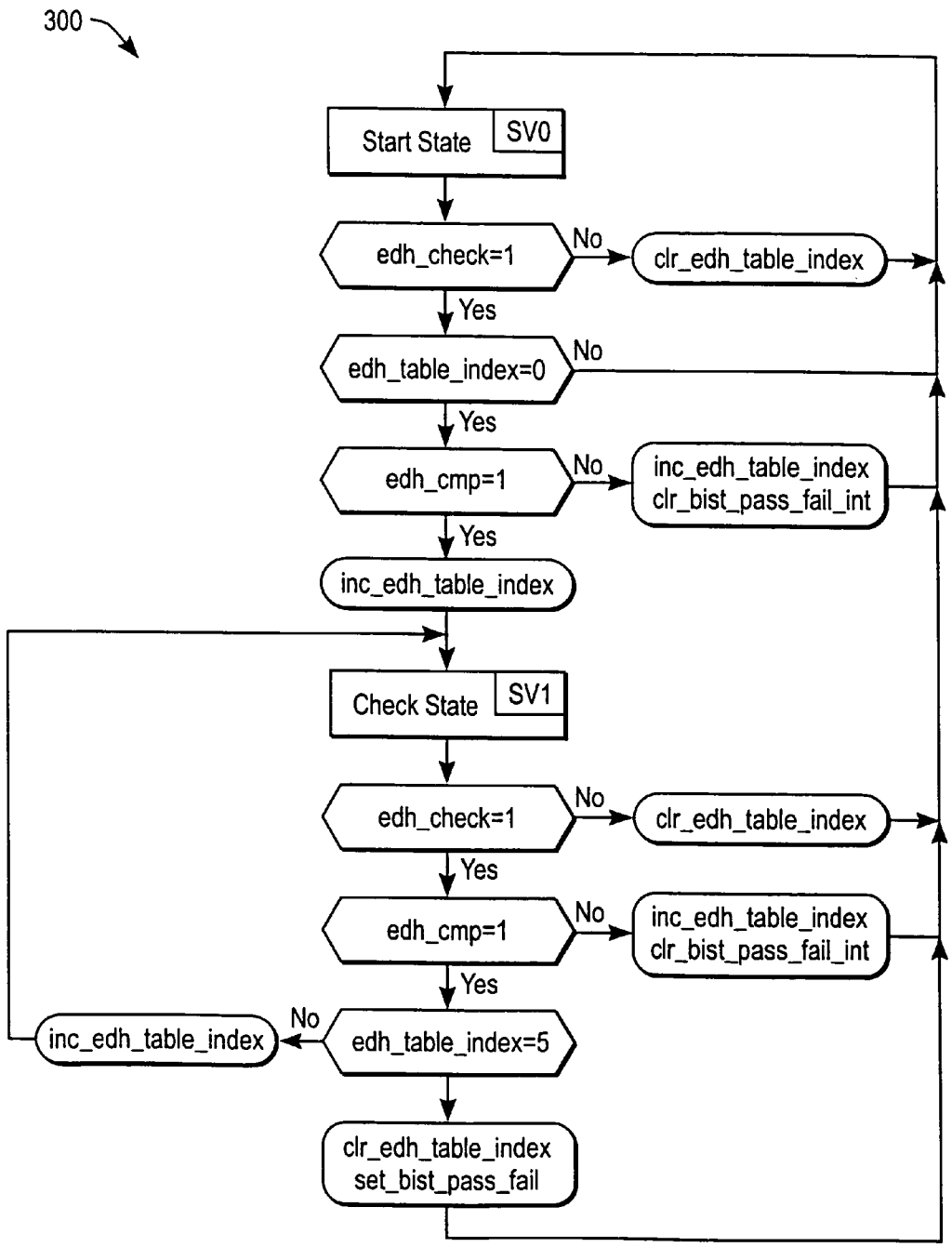
FIG. 9 is a flowchart illustrating an exemplary programmed method according to which a BIST state machine may operate.

FIG. 9 is a flowchart illustrating a programmed method 300, according to an exemplary embodiment of the present invention, according to which the BIST state machine 46 of the exemplary generator 200 shown in FIG. 4 may operate.

Testing of Transmit, Channel and Receive Units

Figure 10:
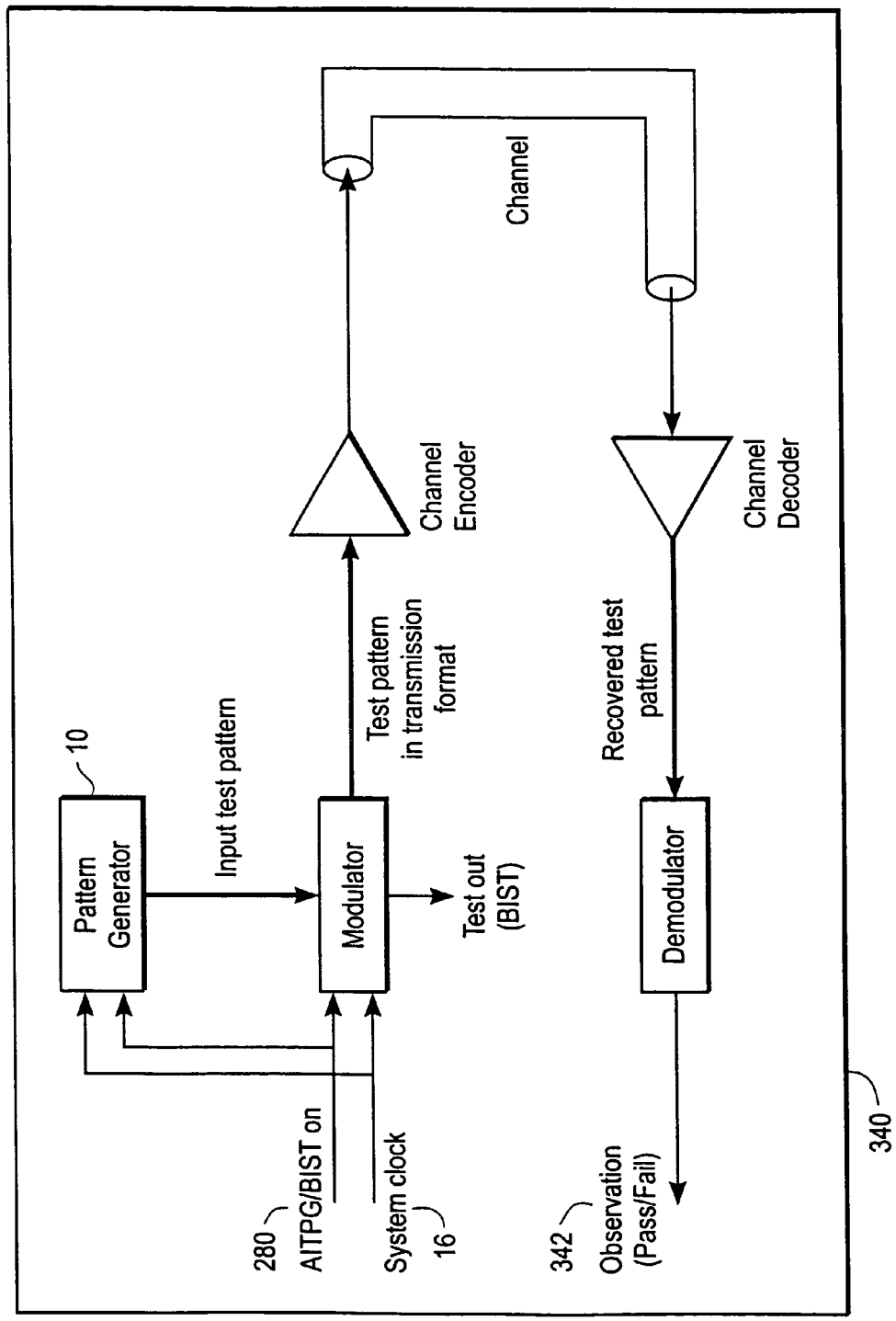
FIG. 10 is a block diagram illustrating an exemplary arrangement by which a complete test of transmit, channel and receive units of a communications device may be performed.

FIG. 10 is a block diagram illustrating an arrangement by which a complete test of transmit, channel and receive units of an exemplary communications device 340 may be performed. Specifically, for functional testing, a set of patterns that are verifiable by an observation system must be determined. To commence a complete test of the device 340, the device 340 is placed in a pattern generation mode by assertion of an appropriate signal as the test mode number input signal 280. A suitable clock is applied as the system clock 16, and the output of a receiver of the device 340 is observed and monitored 342. In one embodiment, no additional test equipment is required. The observing system may perform any operations that are suited to decoding the received data, such as a straight forward comparison of the supplied and received patterns. Other methods of verification utilize a visual verification (e.g., for video channels), control systems (e.g., where the transmitted pattern instructs an observing unit to perform task) and data analysis systems (e.g., where the stream and/or packets of test data are evaluated to determine the validity thereof).

Considering specifically the testing of a digital television video device, such a device is typically placed in one of multiple pattern generation modes (e.g., a PAL color bar mode) and an appropriate clock signal is applied. The outputs of the digital television video device is then connected to a SMPTE 259M compatible picture monitor, whereafter the functionality of the device may be verified if color bars are displayed. Simultaneously, the BIST components of the generator 10 examine the internal logic status for the device, and the result of the BIST may be observed utilizing a test-out pin.

In a summary, after test data, for example in the form of test patterns generated by a pattern generator 10, is applied to a device or system, the following aspects of the system may be verified:
1. The functionality of a physical layer (e.g., the portion of the system that drives data onto a communications channel);
2. The functionality of modulator logic (e.g., by checking the output data and by looking at a BIST result pin);
3. The functionality of a receiver, and the compatibility thereof with a communications standard or system;
4. The system functionality by verifying the input controls properly control the device, and that the device is operating at full speed; and
5. A high level of fault coverage by performance of fault analysis of output data.

Integrated Circuit

Figure 11:
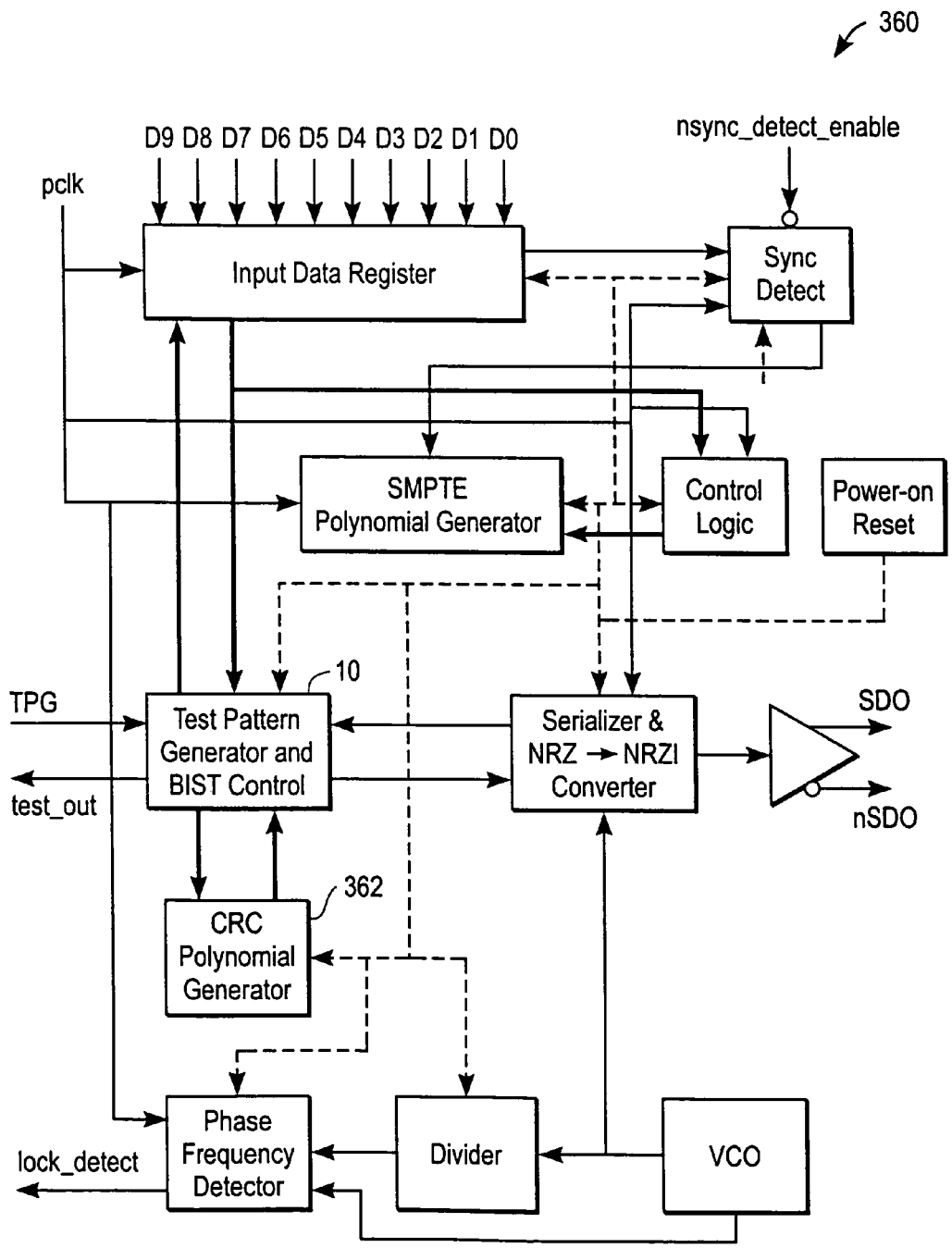
FIG. 11 is a block diagram illustrating an integrated circuit that incorporates a test pattern generator with integrated BIST control circuitry.

FIG. 11 is at block diagram illustrating an integrated circuit 360, according to an exemplary embodiment of the present invention, that incorporates a test pattern generator 10 with integrated BIST control circuitry. Specifically, the integrated circuit 360 comprises a digital television video parallel-to-serial data converter having built-in self-test functionality and test pattern generation system. The test pattern generation system incorporates an algorithmic digital television video test pattern generator 10, a digital television video checksum generator 362 and a comparator with precomputed, stored checksum values for the algorithmic test patterns. The test pattern generation system is utilized to perform a complete go/no-go test of the integrated circuit 316, including a test of all subsystem elements that are illustrated in FIG. 11.

Thus, an algorithmic test pattern generator, with built-in-self-test (BIST) capabilities to verify a circuit and a system including such a circuit, and a method of operating such an algorithmic test pattern generator, have been described. Although the present invention has been described with reference to specific exemplary embodiments, it will be evident that various modifications and changes may be made to these embodiments without departing from the broader spirit and scope of the invention. Accordingly, the specification and drawings are to be regarded in an illustrative rather than a restrictive sense.

What is claimed is:

1. A circuit for testing that is capable of creating any of a plurality of creatable component video test patterns, comprising:

a pattern selection register that is operable to store and provide a pattern selection value indicating a component video test pattern selected for creation among the plurality of creatable component video test patterns, wherein each of the plurality of creatable component video test patterns is, when created, a complete television video picture suitable for testing of digital television video processing equipment;

a pattern generation state machine that is operable to control a sequencing of a creation of the component video test pattern selected for creation by providing a plurality of clear and increment signals;

a memory component that is operable to provide a table output value based on the plurality of clear and increment signals and the pattern selection value, wherein the memory component includes:

a header table that stores:

a plurality of data samples that each include a unique data word; and a sequence of data that includes a portion of a repeating horizontal blanking data sequence, and further includes a repeat field that indicates a number of repetitions for the repeating horizontal blanking sequence; and an output register that is operable to create the component video test pattern selected for creation based on the table output value.

2. The circuit of claim 1, wherein the plurality of creatable component video test patterns includes sixteen component video test patterns.

3. The circuit of claim 1, further comprising:
a pattern change detector that is operable to assert a change pattern signal if the pattern selection value changes, wherein the pattern generation state machine resets if the change pattern signal is asserted.

4. The circuit of claim 1, wherein each of the unique data words is a unique ten-bit data word.

5. The circuit of claim 4, wherein each of the plurality of data samples is a forty-bit data sample.

6. The circuit of claim 1, the circuit further comprising:
a built-in self test circuit that stores, for each of the plurality of creatable component video test patterns, a pre-calculated expected checksum, wherein the built-in self test circuit is operable to perform actions, including:
determining a checksum for the component video test pattern output by the output register; and
comparing the checksum with the pre-calculated expected checksum for the selected component video test pattern; and
a BIST result output pin that is arranged to provide a BIST result signal that indicates a result of the checksum comparison.

7. The circuit of claim 6, wherein determining the checksum for the created component video test pattern is accomplished concurrently with displaying a picture based on the created component video test pattern.

8. The circuit of claim 1, wherein the memory circuit further includes an equalizer pathological table.

9. The circuit of claim 8, further comprising:
a plurality of logic gates that are operable to select one of two values associated with reading from the equalizer pathological table based on a line count value and the pattern selection value.

10. The circuit of claim 1, wherein each table in the memory component is organized as a plurality of five-sample segments; each of the five-sample segments includes four 10-bit data samples, and further includes a repeat field having a repeat value that indicates how many times the four 20-bit data samples are to be repeated; for each of the plurality of data samples that each include a unique data word, the repeat field has a value of one; and wherein for each of the five-sample segments other than the plurality of samples that each include a unique data word, the repeat field has a value greater than ten.

11. The circuit of claim 10, wherein the memory component further includes:
a line index table that stores values indicating a number of lines to transmit before switching to and from vertical blanking lines to active video lines.

12. The circuit of claim 11, further comprising:
a line counter that is operable to track a number of lines transmitted, and to compare the number of lines transmitted against values in the line index table to determine when to switch to and from vertical blanking lines and active video lines;
a sample counter; and
a repeat counter, wherein the repeat counter is employed in control of the repeating of each of the four 10-bit data samples a number of times indicated by the repeat value.

13. A circuit for testing that is capable of creating any of a plurality of creatable video test patterns, comprising:
a patter generation state machine that is operable to control a sequencing of a creation of a video test pattern selected for creation among the plurality of creatable video test pattern; and
a memory component that is operable to provide a table output value based on the control of the sequencing, wherein the memory component includes:
a header table that stores:
a plurality of data samples that each include a unique data word; and
a sequence of data that includes a portion of a repeating horizontal blanking data sequence, and further includes a repeat field that indicates a number of repetitions for the repeating horizontal blanking sequence; and
a pattern selection register that is operable to store and provide a pattern selection value, wherein the pattern selection value indicates which of the plurality of creatable video test patterns has been selected for creation.

14. A circuit for testing, comprising:
a pattern selection register that is operable to store and provide a pattern selection value indicating a component video test pattern selected for creation among a plurality of at least sixteen creatable video test patterns, wherein the circuit for testing is capable of creating any of the plurality of at least sixteen creatable component video test patterns upon selection; and wherein each of the plurality of at least sixteen creatable component video test patterns is, when created, a complete television video picture suitable for testing of digital television video processing equipment;
a pattern generation state machine that is operable to control a sequencing of a creation of the component video test pattern selected for creation by providing a plurality of clear and increment signals;
a memory component that is operable to provide a table output value based on the plurality of clear and increment signals and the pattern selection value, wherein the table output value is provided by tracking a location in a data sequence based on the clear and increment signals, and wherein the memory component includes:
a line index table that stores values indicating a number of lines to transmit before switching to and from vertical blanking lines to active video lines; and
a header table that stores:
a plurality of forty-bit data samples that each include a unique ten-bit data word; and
a sequence of data that includes a portion of a repeating horizontal blanking data sequence, and further includes a repeat field that indicates a number of repetitions for the repeating horizontal blanking sequence,
a colour table;
a PLL pathological table; and
an equalizer pathological table;
a plurality of logic gates that are operable to select one of two values associated with reading from the equalizer pathological table based on a line count value and the pattern selection value;

an output register that is operable to create the component video test pattern selected for creation based on the table output value;

a built-in self test circuit that stores, for each of the plurality of at least sixteen creatable component video test patterns, a pre-calculated expected checksum, wherein the built-in self test circuit is operable to perform actions, including:

determining a checksum for the created component video test pattern output by the output register; and comparing the checksum with the pre-calculated expected checksum for the selected component video test pattern; and a BIST result output pin that is arranged to provide a BIST result signal that indicates a result of the checksum comparison.

15. The circuit of claim 14, wherein each table in the memory component is organized as a plurality of five-sample segments; each of the five-sample segments includes four 10-bit data samples, and further includes a ten-bit repeat field including a repeat value that indicates how many times the four 10-bit data samples are to be repeated; for each of the plurality of data samples that each include a unique data word, the repeat field has a value of one; and wherein for each of the five-sample segments other than the plurality of samples that each include a unique data word, the repeat field has a value greater than ten.

16. The circuit of claim 15, further comprising:

a line counter that is operable to track a number of lines transmitted, and to compare the number of lines transmitted against values in the line index table to determine when to switch to and from vertical blanking lines and active video lines;

a sample counter; and a repeat counter, wherein the repeat counter is employed in the control of the repeating of each of the four 10-bit data samples a number of times indicated by the repeat value.

* * * * *

UNITED STATES PATENT AND TRADEMARK OFFICE
CERTIFICATE OF CORRECTION

PATENT NO. : 7,062,696 B2
APPLICATION NO. : 09/759557
DATED : June 13, 2006
INVENTOR(S) : John Lee Barry et al.

It is certified that error appears in the above-identified patent and that said Letters Patent is hereby corrected as shown below:

In the Specification:
Title Page #56
Page 2, Col. 1 (Other Publications), Line 2, Delete "doucment" and insert --document--.

Title Page #56
Page 2, Col. 2 (Other Publications), Line 2, Delete "Singals" and Insert -- Signals --.

Sheet 4 of 18 (Fig. 2), Line 2 (Box 66), Delete "Algorithmmically" and insert -- Algorithmically --.

Sheet 6 of 18 (Fig. 4A), Line 1 (Below Box 22), Delete "pattern-select_reg[3:0]" and insert -- pattern_select_reg"3:0" --.

Column 5, Line 4, Delete "assets" and insert -- asserts --.

Column 7, Line 1, "five sample" and insert -- five-sample --.

Column 11, Line 22, In Claim 6, delete "self test" and insert -- self-test --.

Column 11, line 25, In Claim 6, delete "self test" and insert -- self-test --.

Column 11, Line 51, In Claim 10, delete "20-bit" and insert -- 10-bit --.

Column 12, Line 8, In Claim 13, delete "patter" and insert -- pattern --.

Column 12, Line 60, In Claim 14, delete "sequence," and insert -- sequence; --.

Column 13, Line 4, In Claim 14, delete "self test" and insert -- self-test --.

UNITED STATES PATENT AND TRADEMARK OFFICE
CERTIFICATE OF CORRECTION

PATENT NO. : 7,062,696 B2
APPLICATION NO. : 09/759557
DATED : June 13, 2006
INVENTOR(S) : John Lee Barry et al.

It is certified that error appears in the above-identified patent and that said Letters Patent is hereby corrected as shown below:

Column 13, Line 7, In Claim 14, delete "self test" and insert -- self-test --.

Signed and Sealed this

Fifth Day of December, 2006

JON W. DUDAS
*Director of the United States Patent and Trademark Office*